(12) United States Patent
Hsieh et al.

(10) Patent No.: US 11,894,489 B2
(45) Date of Patent: Feb. 6, 2024

(54) SEMICONDUCTOR DEVICE, SEMICONDUCTOR COMPONENT AND DISPLAY PANEL INCLUDING THE SAME

(71) Applicant: EPISTAR CORPORATION, Hsinchu (TW)

(72) Inventors: Min-Hsun Hsieh, Hsinchu (TW); Yu-Tsu Lee, Hsinchu (TW); Wei-Jen Hsueh, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 129 days.

(21) Appl. No.: 17/203,293

(22) Filed: Mar. 16, 2021

(65) Prior Publication Data
US 2022/0302346 A1  Sep. 22, 2022

(51) Int. Cl.
  *H01L 33/30* (2010.01)
  *H01L 33/00* (2010.01)
  *H01L 33/62* (2010.01)
  *H01L 27/15* (2006.01)

(52) U.S. Cl.
  CPC .......... *H01L 33/30* (2013.01); *H01L 27/156* (2013.01); *H01L 33/0062* (2013.01); *H01L 33/62* (2013.01)

(58) Field of Classification Search
  CPC ... H01L 33/30; H01L 27/156; H01L 33/0062; H01L 33/62; H01L 33/0066; H01L 33/0093; H01L 33/38
  See application file for complete search history.

(56) References Cited

U.S. PATENT DOCUMENTS

| | | | |
|---|---|---|---|
| 8,592,847 B2 | 11/2013 | Chen et al. | |
| 2002/0053676 A1* | 5/2002 | Kozaki | H01S 5/3407 257/88 |
| 2009/0108271 A1* | 4/2009 | Chou | H01L 25/0753 257/E33.056 |
| 2016/0099386 A1 | 4/2016 | Youn et al. | |
| 2019/0115328 A1* | 4/2019 | Lee | H01L 33/00 |
| 2020/0111852 A1* | 4/2020 | Lee | H10K 50/81 |
| 2021/0036188 A1* | 2/2021 | Kuo | H01L 33/44 |
| 2021/0249554 A1* | 8/2021 | Lu | H01L 33/025 |
| 2021/0305475 A1* | 9/2021 | Kong | H01L 33/62 |
| 2021/0399148 A1* | 12/2021 | Okamoto | H01L 31/035209 |

OTHER PUBLICATIONS

Shao et al., "Metal-insulator-semiconductor structure for deep-ultraviolet light-emitting diodes to increase the electron injection in the cathode region", Published in Superlattices and Microstructures 140 (2020) 106467, 9 pages.

\* cited by examiner

*Primary Examiner* — Ratisha Mehta
(74) *Attorney, Agent, or Firm* — DITTHAVONG, STEINER & MLOTKOWSKI

(57) ABSTRACT

A semiconductor device and a method for manufacturing the same are provided. The semiconductor device includes a first semiconductor layer, an active region, a p-type or n-type layer, and a first metal element-containing structure. The first semiconductor layer has a surface including a first portion and a second portion. The active region is located on the first portion and includes AlGaInAs, InGaAsP, AlGaAsP or AlGaInP. The p-type or n-type layer includes an oxygen element (O) and a metal element, and is located on the second portion. The first metal element-containing structure is located on the p-type or n-type layer. The p-type or n-type layer physically contacts the first metal element-containing structure and the first semiconductor layer.

20 Claims, 11 Drawing Sheets

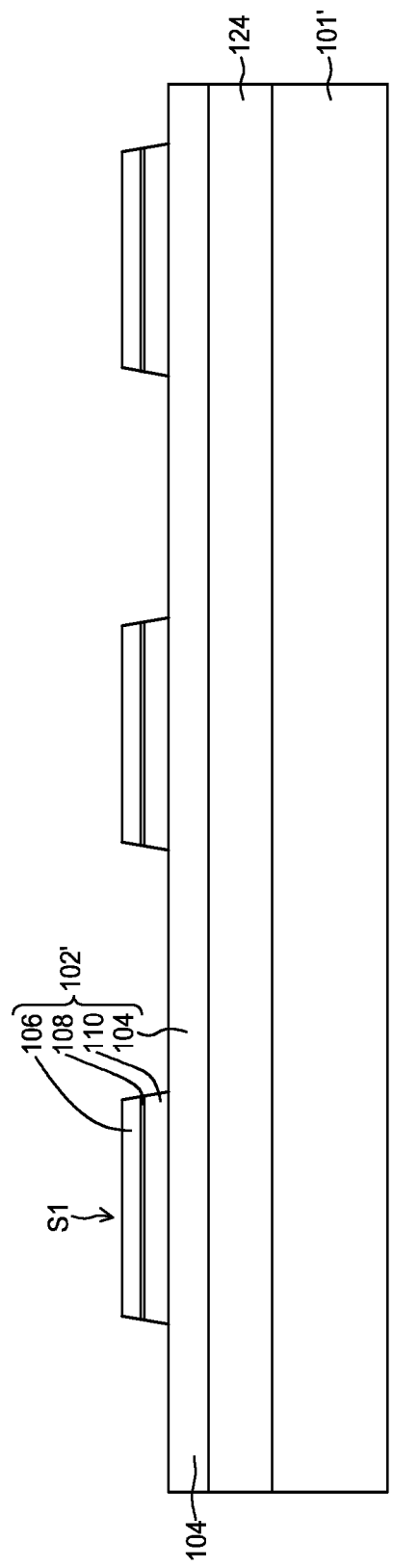
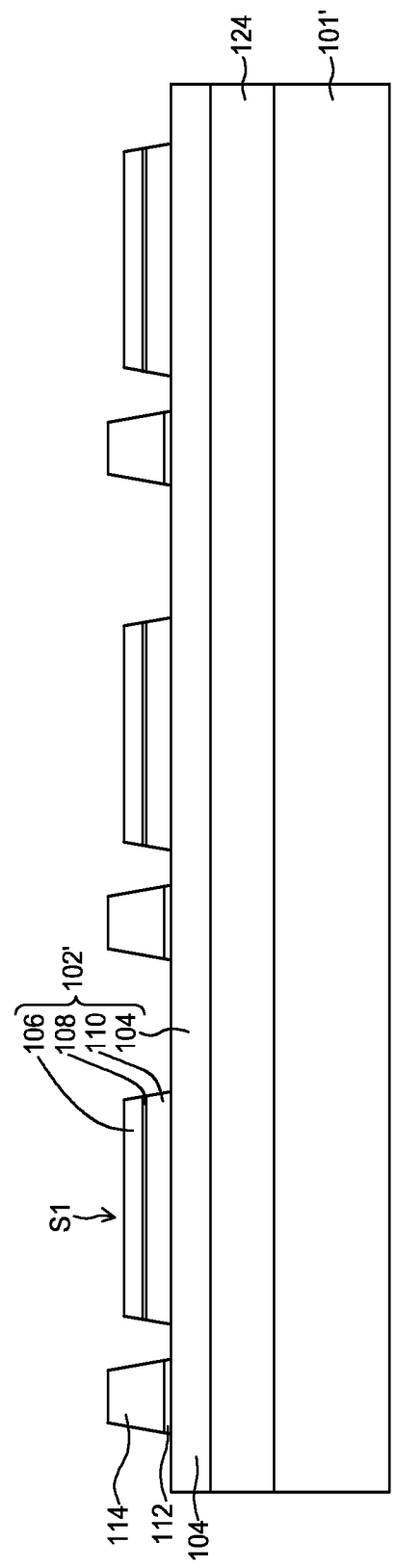

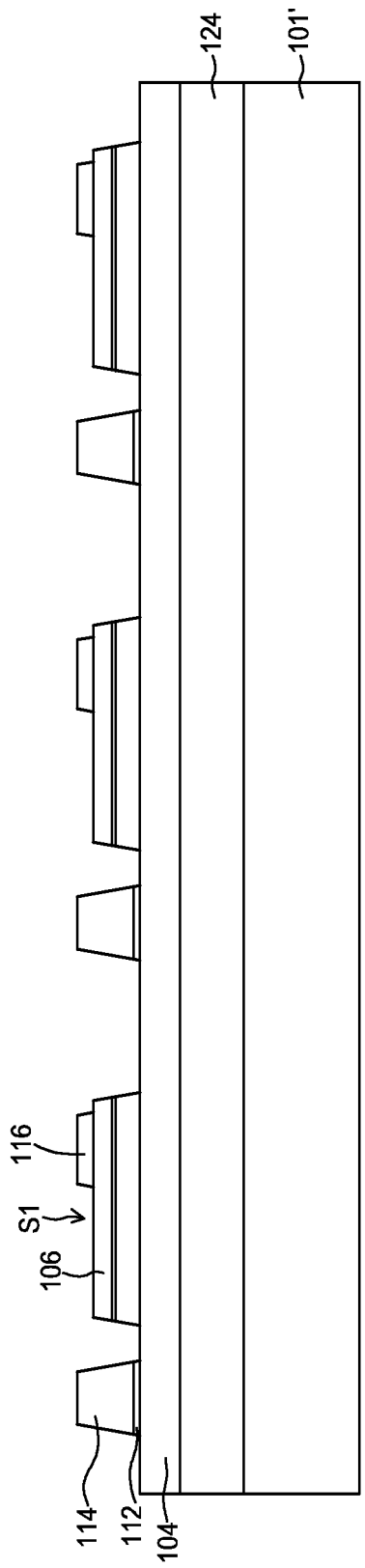
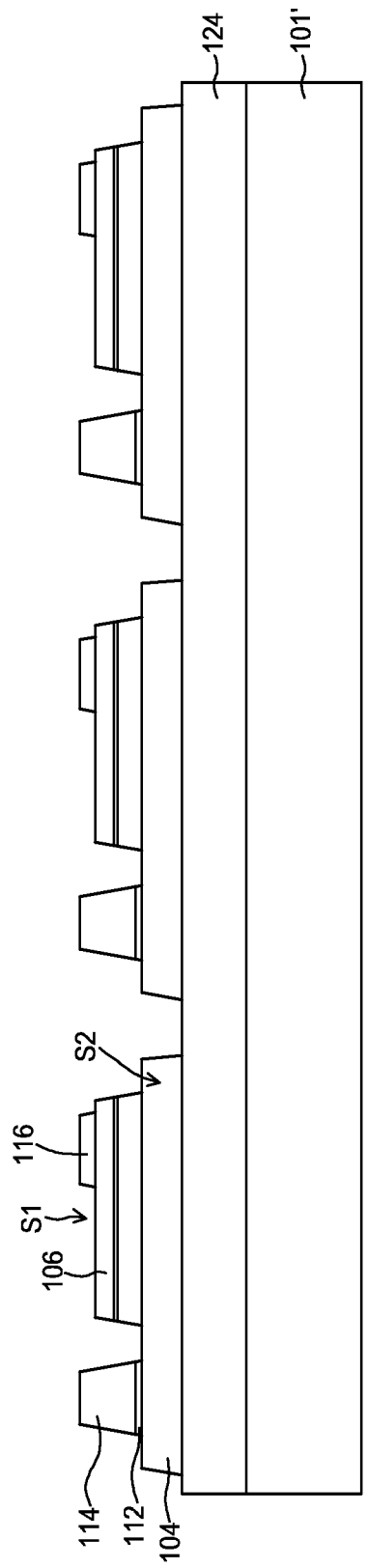

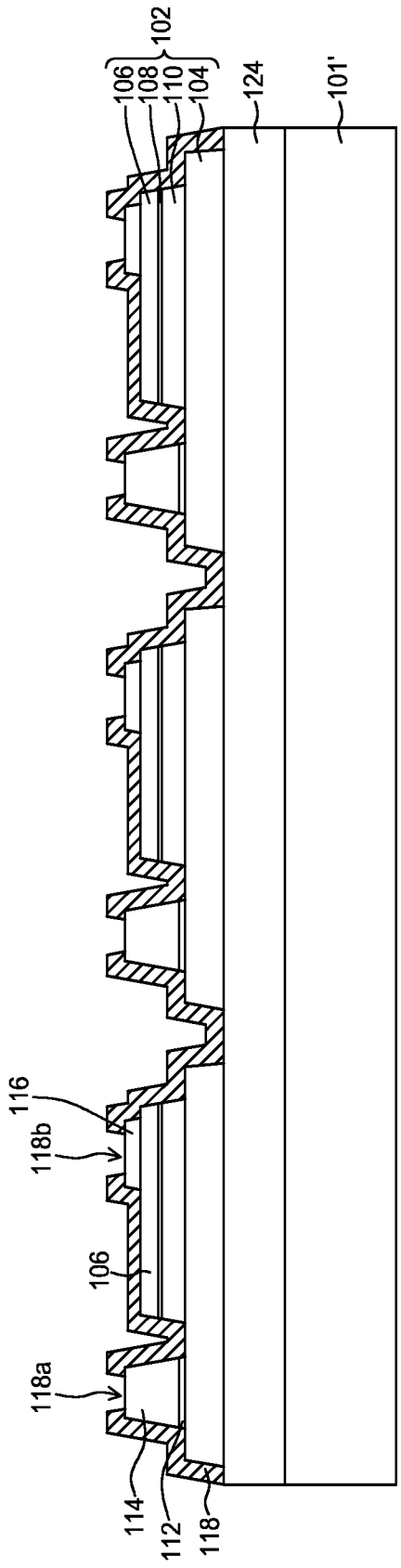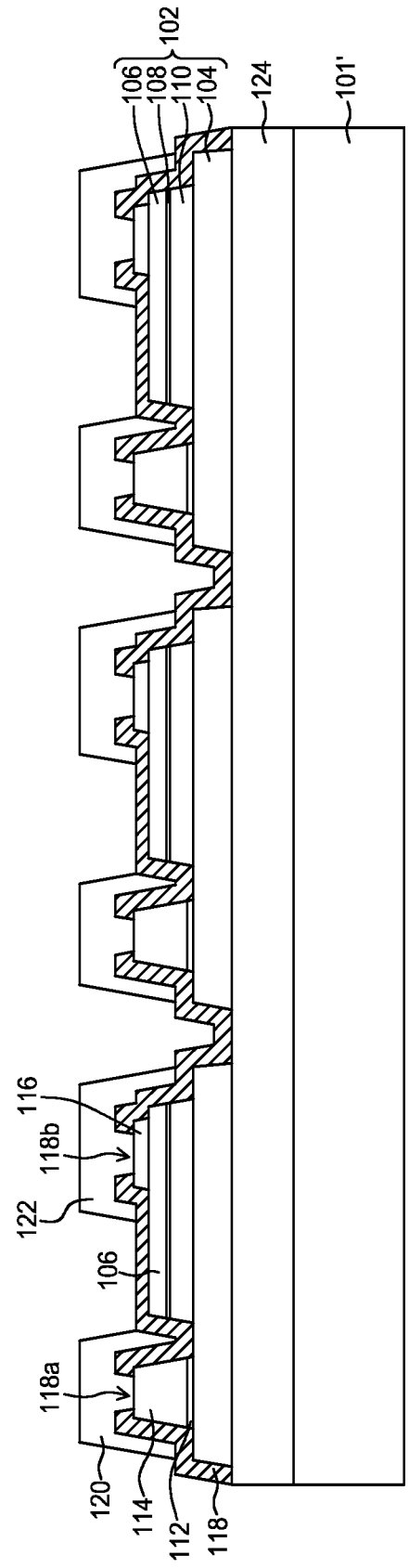

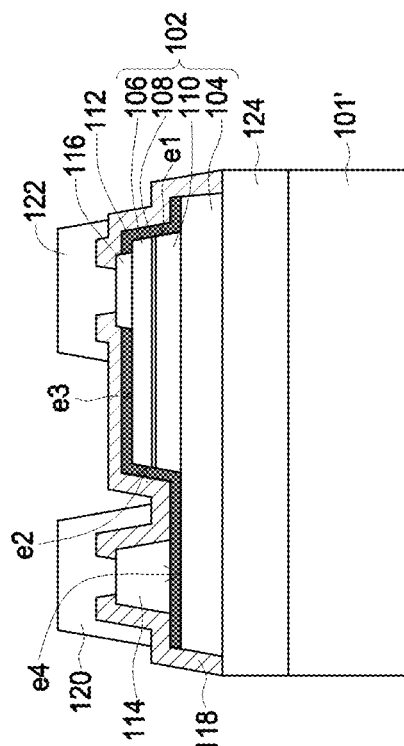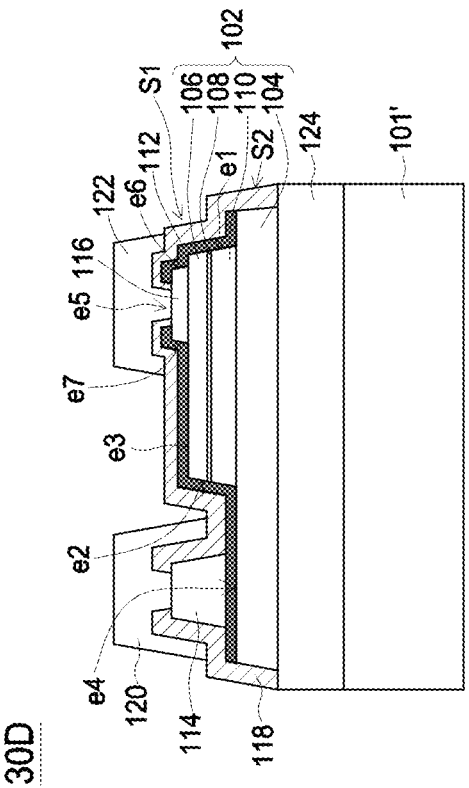
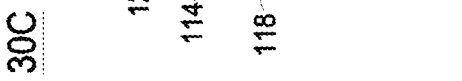
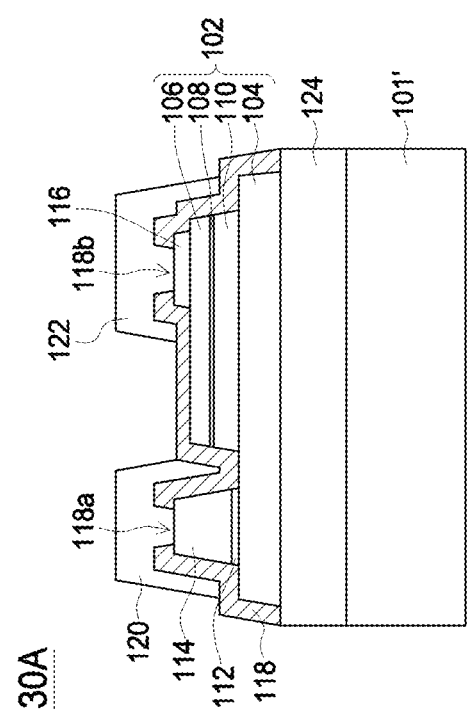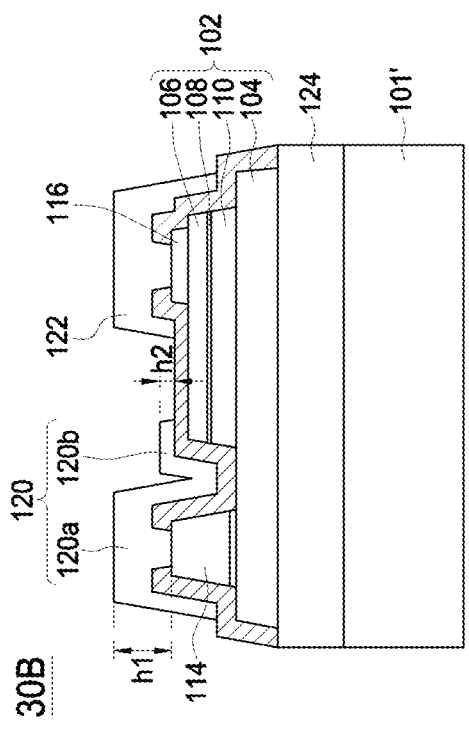

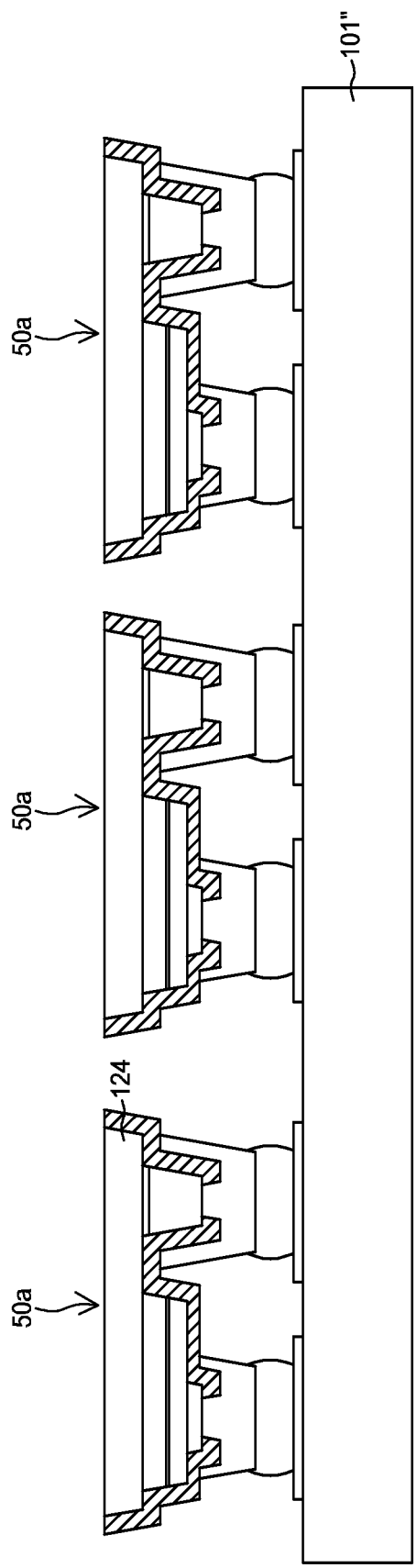
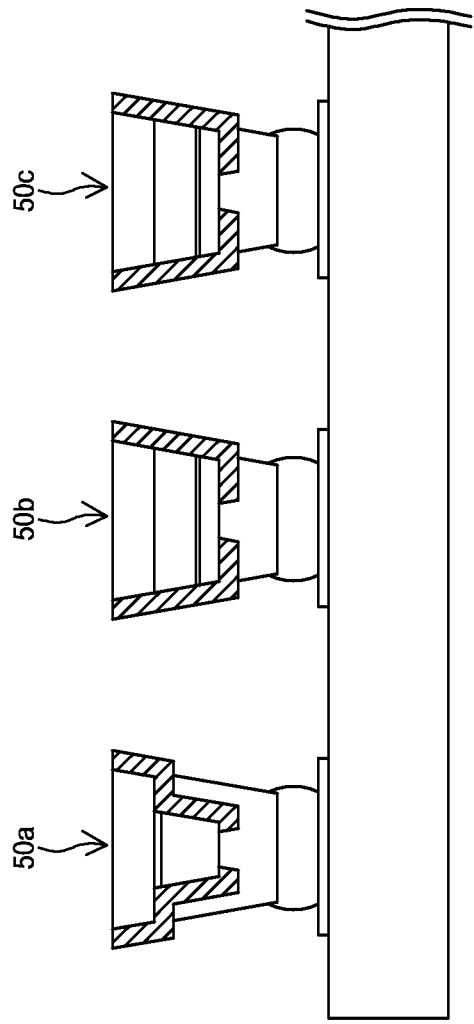
FIG. 5D
FIG. 5E

SEMICONDUCTOR DEVICE, SEMICONDUCTOR COMPONENT AND DISPLAY PANEL INCLUDING THE SAME

FIELD OF DISCLOSURE

The present disclosure relates to a semiconductor device and in particular to a semiconductor light-emitting device such as a light-emitting diode. The present disclosure also relates to a method for manufacturing the semiconductor device, a semiconductor component or a display panel including the semiconductor device.

BACKGROUND OF THE DISCLOSURE

Semiconductor devices are widely used in many applications. Various researches and developments of related material used in the semiconductor devices have been conducted. For example, a group III-V semiconductor material containing a group III element and a group V element may be applied to various optoelectronic devices, such as light emitting diodes (LEDs), laser diodes (LDs), photoelectric detectors, solar cells or power devices, such as switches or rectifiers. In recent years, the optoelectronic devices have been widely applied in fields including lighting, medical, display, communication, and sensing systems. The light-emitting diode, which is one of the semiconductor light-emitting devices, has low energy consumption and long operating lifetime, and is therefore widely used in various fields.

SUMMARY OF THE DISCLOSURE

The present disclosure provides a semiconductor device. The semiconductor device includes a first semiconductor layer, an active region, a p-type or n-type layer, and a first metal element-containing structure. The first semiconductor layer has a surface including a first portion and a second portion. The active region is located on the first portion and includes AlGaInAs, InGaAsP, AlGaAsP or AlGaInP. The p-type or n-type layer includes an oxygen element (O) and a metal element, and is located on the second portion. The first metal element-containing structure is located on the p-type or n-type layer. The p-type or n-type layer physically contacts the first metal element-containing structure and the first semiconductor layer.

The present disclosure also provides a method for manufacturing a semiconductor device. The method includes steps of providing a growth substrate; forming a semiconductor stack including a first semiconductor layer and an active region on the growth substrate; bonding the semiconductor stack on a bonding substrate; removing the growth substrate; removing a portion of the semiconductor stack to expose the first semiconductor layer; forming a p-type or n-type layer including an oxygen element (0) and a metal element on the first semiconductor layer; and forming a first metal element-containing structure on the p-type or n-type layer.

BRIEF DESCRIPTION OF THE DRAWINGS

FIG. 3A to FIG. 3J show a method for manufacturing a semiconductor device in accordance with an embodiment of the present disclosure.

FIG. 3K shows a schematic sectional view of a semiconductor device in accordance with an embodiment of the present disclosure.

FIG. 3L shows a schematic sectional view of a semiconductor device in accordance with an embodiment of the present disclosure.

FIG. 3M shows a schematic sectional view of a semiconductor device in accordance with an embodiment of the present disclosure.

FIG. 5D and FIG. 5E show schematic partial sectional views of a display panel in accordance with an embodiment of the present disclosure.

DETAILED DESCRIPTION OF THE DISCLOSURE

Figure 1:
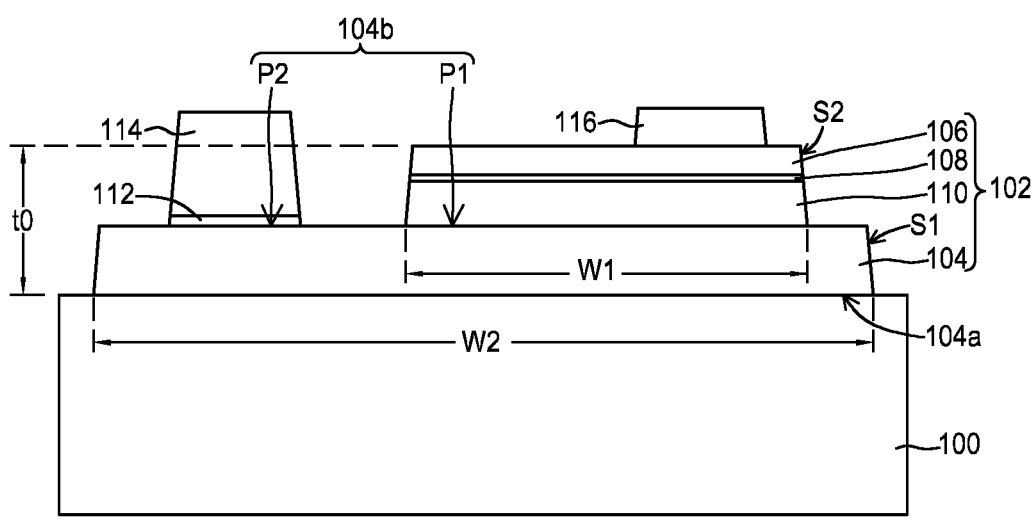
FIG. 1 shows a schematic sectional view of a semiconductor device in accordance with an embodiment of the present disclosure.

The following embodiments will be described with accompany drawings to disclose the concept of the present disclosure. In the drawings or description, same or similar portions are indicated with same or similar numerals. Furthermore, a shape or a thickness of a member in the drawings may be enlarged or reduced. Particularly, it should be noted that a member which is not illustrated or described in drawings or description may be in a form that is known by a person skilled in the art.

In the present disclosure, if not otherwise specified, the general formula InGaP represents $In_{x0}Ga_{1-x0}P$, wherein $0<x0<1$; the general formula AlInP represents $Al_{x1}In_{1-x1}P$, wherein $0<x1<1$; the general formula AlGaInP represents $Al_{x2}Ga_{x3}In_{1-x2-x3}P$, wherein $0<x2<1$ and $0<x3<1$; the general formula InGaAsP represents $In_{x4}Ga_{1-x4}As_{x5}P_{1-x5}$, wherein $0<x4<1$ and $0<x5<1$; the general formula AlGaInAs represents $Al_{x6}Ga_{x7}In_{1-x6-x7}As$, wherein $0<x6<1$ and $0<x7<1$; the general formula InGaAs represents $In_{x8}Ga_{1-x8}As$, wherein $0<x8<1$; the general formula AlGaAs represents $Al_{x9}Ga_{1-x9}As$, wherein $0<x9<1$; the general formula InGaN represents $In_{x10}Ga_{1-x10}N$, wherein $0<x10<1$; the general formula AlGaN represents $Al_{x11}Ga_{1-x11}N$, wherein $0<x11<1$; the general formula AlGaAsP represents $Al_{x12}Ga_{1-x12}As_{x13}P_{1-x13}$, wherein $0<x12<1$ and $0<x13<1$; the general formula InGaAsN represents $In_{x14}Ga_{1-x14}As_{x15}N_{1-x15}$, wherein $0<x14<1$ and $0<x15<1$; the general formula AlInGaN represents $Al_{x16}In_{x17}Ga_{1-x16-x17}N$, wherein $0<x16<1$ and $0<x17<1$. The content of each element may be adjusted for different purposes, for example, for adjusting the energy gap, or the peak wavelength or dominant wavelength when the semiconductor device is a light-emitting device.

The semiconductor device of the present disclosure is, for example, an optoelectric device (such as light-emitting device (a light-emitting diode or a laser diode)) or a light absorbing device (a photo-detector or solar cell) or a non-optoelectric device. Qualitative or quantitative analysis of the composition and/or dopant contained in each layer of the semiconductor device of the present disclosure may be conducted by any suitable method, such as, a secondary ion mass spectrometer (SIMS), Energy-dispersive X-ray spectroscopy (EDX), X-ray photoelectron spectroscopy (XPS), or Ultraviolet Photoelectron Spectroscopy (UPS). A thickness of each layer may be obtained by any suitable method, such as a transmission electron microscopy (TEM), a scanning electron microscope (SEM) or a scanning transmission electron microscope (STEM).

A person skilled in the art can realize that other members can be included based on a structure recited in the following embodiments. For example, if not otherwise specified, a description similar to "a first layer/structure is on or under a second layer/structure" can include an embodiment in which the first layer/structure directly (or physically) contacts the second layer/structure, and can also include an embodiment in which another structure is provided between the first layer/structure and the second layer/structure, such that the first layer/structure and the second layer/structure do not physically contact each other. In addition, it should be realized that a positional relationship of a layer/structure may be altered when being observed in different orientations.

Furthermore, in the present disclosure, a description of "a layer/structure only includes M material" means the M material is the main constituent of the layer/structure; however, the layer/structure may still contain a dopant or unavoidable impurities.

FIG. 1 shows a schematic sectional view of a semiconductor device 10 in accordance with an embodiment of the present disclosure.

As shown in FIG. 1, the semiconductor device 10 includes a base 100, a semiconductor structure 102 on the base 100. The semiconductor structure 102 can be an epitaxial structure and can include a first semiconductor layer 104, a second semiconductor layer 106, and an active region 108 between the first semiconductor layer 104 and the second semiconductor layer 106. In the embodiment, the semiconductor structure 102 further includes a third semiconductor layer 110 between the active region 108 and the first semiconductor layer 104. A p-type or n-type layer 112 is located on the first semiconductor layer 104. As shown in FIG. 1, a first metal element-containing structure 114 and a second metal element-containing structure 116 are provided on the semiconductor structure 102. Specifically, the first semiconductor layer 104 has a first surface 104a facing the base 100 and a second surface 104b facing the first metal element-containing structure 114 and the second metal element-containing structure 116. The second surface 104b includes a first portion P1 and a second portion P2.

In the embodiment, the second semiconductor layer 106, the active region 108 and the third semiconductor layer 110 are located on the first portion P1 without locating on the second portion P2. The p-type or n-type layer 112 is located on the second portion P2 without locating on the first portion P1, and the first metal element-containing structure 114 is located on the p-type or n-type layer 112. Specifically, the p-type or n-type layer 112 is located between and physically contacts the first metal element-containing structure 114 and the first semiconductor layer 104. In the embodiment, the second semiconductor layer 106, the active region 108 and the third semiconductor layer 110 forms a first mesa structure S1 on the first semiconductor layer 104, and the first semiconductor layer 104 forms a second mesa structure S2.

As shown in FIG. 1, the first mesa structure S1 has a first width W1 and the second mesa structure S2 has a second width W2 larger than the first width W1. The first width W1 is the maximum width of the first mesa structure S1 and the second width W2 is the maximum width of the second mesa structure S2. The first mesa structure S1 and the second mesa structure S2 respectively can have a trapezoid shape or a rectangular shape in the sectional view.

In the embodiment, the side surfaces of the first mesa structure S1 are not flush with the side surfaces of the second mesa structure S2 in the sectional view. In an embodiment, the first mesa structure S1 and the second mesa structure S2 respectively can have a rounded rectangular shape in a top view for reducing point discharge and improving stability thereof. In an embodiment, the semiconductor device 10 can have a length less than 150 μm or 100 μm and a width less than 150 μm or 100 μm in a top view. A ratio of the length to the width of the semiconductor device 10 can be in a range of 0.3 to 1.

The base 100 includes a conductive or an insulating material. The conductive material includes gallium arsenide (GaAs), indium phosphide (InP), silicon carbide (SiC), gallium phosphide (GaP), zinc oxide (ZnO), gallium nitride (GaN), aluminum nitride (AlN), germanium (Ge) or silicon (Si). The insulating material includes sapphire. In an embodiment, the base 100 is a growth substrate, that is, the semiconductor structure 102 is epitaxially formed on the base 100 by metal organic chemical vapor deposition (MOCVD). In an embodiment, the base 100 is a bonding substrate instead of a growth substrate, and it can be bonded to the semiconductor structure 102 via an adhesive structure 124 (as shown in FIG. 2B). In an embodiment, the semiconductor device 10 can be devoid of the base 100. The semiconductor structure 102 has a total thickness t0 less than or equal to 10 μm. A ratio of the total thickness t0 to the width or the length of the semiconductor device 10 can be less than or equal to 0.5, such as less than 0.3 or 0.1, so that the structural stability of the semiconductor device 10 can be ensured during manufacturing.

In an embodiment, the first semiconductor layer 104 includes a first dopant and the second semiconductor layer 106 includes a second dopant so that the first semiconductor layer 104 and the second semiconductor layer 106 have different conductivity types. For example, the first semiconductor layer 104 is n-type and the second semiconductor layer 106 is p-type, or the first semiconductor layer 104 is p-type and the second semiconductor layer 106 is n-type. In an embodiment, the first dopant and the second dopant respectively includes a group II, group IV, or group VI element in the periodic table. For example, the first dopant and the second dopant can respectively include C, Zn, Si, Ge, Sn, Se, Mg or Te. The first semiconductor layer 104 and the second semiconductor layer 106 respectively provide electrons and holes, or holes and electrons. In an embodiment, the third semiconductor layer 110 has the same conductivity type as the first semiconductor layer 104. In an embodiment, the first semiconductor layer 104, the second semiconductor layer 106, the active region 108, and the third semiconductor layer 110 respectively includes a group III-V semiconductor material. In an embodiment, the group III-V semiconductor material contains element(s) of Al, Ga, As, P, N or In. Specifically, in an embodiment, the group III-V semiconductor material is a binary compound semiconductor (such as GaAs, GaP or GaN), a ternary compound semiconductor (such as InGaAs, AlGaAs, InGaP, AlInP, InGaN or AlGaN) or a quaternary compound semiconductor (such as AlGaInAs, AlGaInP, AlInGaN, InGaAsP, InGaAsN or AlGaAsP). In an embodiment, the active region 108 only includes a ternary compound semiconductor (such as InGaAs, AlGaAs, InGaP, AlInP, InGaN, or AlGaN) or a quaternary compound semiconductor (such as AlGaInAs, AlGaInP, AlInGaN, InGaAsP, InGaAsN, or AlGaAsP). In some embodiments, the first semiconductor layer 104, the second semiconductor layer 106, the active region 108, and the third semiconductor layer 110 do not include element N. In some embodiments, the first semiconductor layer 104, the second semiconductor layer 106, the active region 108, and the third semiconductor layer 110 respectively include a phosphide compound or an arsenide compound.

In accordance with an embodiment, when the semiconductor device 10 is a light emitting device, the active region 108 can emit a light during operation. The light includes visible light or invisible light. The peak wavelength of the light emitted is determined by the material composition of the active region 108. The material of the active region 108 may include a ternary compound semiconductor (such as InGaN, InGaAs, AlGaN, AlGaAs or InGaP) or a quaternary compound semiconductor (such as InGaAsP, AlGaInAs, or AlGaInP). In an embodiment, the semiconductor device 10 can emit a blue light or a deep blue light with a peak wavelength of 400 nm to 490 nm, a green light with a peak wavelength of 490 nm to 550 nm, an ultraviolet light with a peak wavelength of 250 nm to 400 nm, a red light with a peak wavelength of 610 nm to 700 nm, a yellow light with a peak wavelength of 530 nm to 600 nm, or an infrared light with a peak wavelength of 700 nm to 1700 nm.

The first metal element-containing structure 114 and the second metal element-containing structure 116 can be respectively a single layer or multiple layers. The first metal element-containing structure 114 and the second metal element-containing structure 116 respectively can have a trapezoid shape or a rectangular shape in the sectional view. In an embodiment, the first metal element-containing structure 114 includes a first metal element M1, and the second metal element-containing structure 116 includes a second metal element M2. The first metal element M1 and the second metal element M2 can be the same or different. In an embodiment, the first metal element-containing structure 114 is devoid of Be.

In an embodiment, the first metal element-containing structure 114 further includes a third metal element M3 different from the first metal element M1. In an embodiment, the first metal element-containing structure 114 includes an alloy containing the first metal element M1 and the third metal element M3. In an embodiment, the first metal element-containing structure 114 includes a first layer physically contacting the p-type or n-type layer 112 and a second layer located on the first layer. In an embodiment, the first layer includes the first metal element M1 and the second layer includes the third metal element M3. In an embodiment, the second metal element-containing structure 116 further includes a fourth metal element M4 different from the second metal element M2. In an embodiment, the second metal element-containing structure 116 includes an alloy containing the second metal element M2 and the fourth metal element M4. In an embodiment, the second metal element-containing structure 116 includes a third layer physically contacting the second semiconductor layer 106 and a fourth layer located on the third layer. In an embodiment, the third layer includes the second metal element M2 and the fourth layer includes the fourth metal element M4. In an embodiment, the third metal element M3 and the fourth metal element M4 can be the same. In an embodiment, the first metal element M1, the second metal element M2, the third metal element M3 and the fourth metal element M4 can be respectively selected from Ti, Ni, Al, Zn, Ge, Mo, W, V, Ga, Au or Ag.

In the embodiment, the first metal element-containing structure 114 does not physically contact the first semiconductor layer 104. The first metal element-containing structure 114 can electrically connect the first semiconductor layer 104 through the p-type or n-type layer 112. In the embodiment, a material of the p-type or n-type layer 112 has a first contact resistivity in a vertical direction, and has a second contact resistivity in a horizontal direction. The second contact resistivity can be higher than the first contact resistivity so that a current mainly flows through the p-type or n-type layer 112 along the vertical direction and the p-type or n-type layer 112 is electrically connected to the first metal element-containing structure 114 and the first semiconductor layer 104. In some embodiments, the first contact resistivity and the second contact resistivity may be measured with units of $\Omega \cdot cm^2$. In some embodiments, when the p-type or n-type layer 112 has a conductivity type different from or same as the conductivity type of the first semiconductor layer 104, the p-type or n-type layer 112 can act as a tunneling layer. In some embodiments, when the p-type or n-type layer 112 has a conductivity type same as the conductivity type of the first semiconductor layer 104, the p-type or n-type layer 112 can further reduce an energy barrier (e.g. Schottky barrier) between the first semiconductor layer 104 and the first metal element-containing structure 114. In the embodiment, the p-type or n-type layer 112 is not overlapped with the active region 108 in a vertical direction. In one embodiment, the first semiconductor layer 104 has a dopant concentration higher than or equal to $1 \times 10^{19}/cm^3$ for reducing the contact resistance between the first semiconductor layer 104 and the first metal element-containing structure 114.

The material of the first semiconductor layer 104 has a conduction band and a valence band, the bottom edge of the conduction band is denoted as Ec and the top edge of the valence band is denoted as Ev. The material of the p-type or n-type layer 112 has a first work function WF1 and the first metal element M1 has a second work function WF2. In some embodiments, when the first semiconductor layer 104 is of an n-type conductivity, the first work function WF1 fulfills WF1<(Ec+Ev)/2. In some embodiments, when the first semiconductor layer 104 is of a p-type conductivity, the first work function WF1 fulfills WF1>(Ec+Ev)/2. In some embodiments, when the p-type or n-type layer 112 is of an n-type conductivity, the second work function WF2 is greater than the first work function WF1. In some embodiments, when the p-type or n-type layer 112 is of a p-type conductivity, the first work function WF1 is greater than the second work function WF2. In some embodiments, by adopting the material of the first semiconductor layer 104, the p-type or n-type layer 112 and the first metal element-containing structure 114 that fulfill the above-mentioned relationships, a contact resistivity between the p-type or n-type layer 112 and the first metal element-containing structure 114 can be further improved. In an embodiment, the material of the p-type or n-type layer 112 has a bandgap larger than that of the first semiconductor layer 104 to prevent the p-type or n-type layer 112 from absorbing light emitted from the active region 108. In an embodiment, the material of the p-type or n-type layer 112 includes an oxygen element (O) and a fifth metal element M5. In an embodiment, the fifth metal element M5 is the same as the first metal element M1 or the third metal element M3 so that an adhesion between the p-type or n-type layer 112 and the first metal element-containing structure 114 can be further improved, and the thermal stability of the semiconductor device 10 may also be elevated. In an embodiment, the fifth metal element M5 is In, Ti, Al, Zn, Ni, Ga, Mo, V, W, or Nb.

Regarding the metal element contained in the p-type or n-type layer, the p-type or n-type layer 112 can contain only one kind of metal elements. The metal elements may include In, Ti, Al, Zn, Ni, Ga, Mo, V, W, or Nb. In some embodiments, the p-type or n-type layer 112 contains two or more kinds of metal elements. For example, in an embodiment, the p-type or n-type layer 112 further includes a sixth metal element M6 different from the fifth metal element M5. The fifth metal element M5 and the sixth metal element M6 can respectively be In, Ti, Al, Zn, Ni, Ga, Mo, V, W, or Nb. In an embodiment, the p-type or n-type layer 112 further includes a group V element (such as N, P or As). Specifically, in an embodiment, the p-type or n-type layer 112 can include a first metal oxide compound formed by the oxygen element and the fifth metal element M5. In an embodiment, the p-type or n-type layer 112 can further include a second metal oxide compound formed by the oxygen element and the sixth metal element M6. In an embodiment, the p-type or n-type layer 112 can further include a third metal oxide compound formed by the oxygen element and the group V element. For example, the first metal oxide compound or the second metal oxide compound can be n-type (such as $TiO_x$, $InO_x$, $MoO_x$, $VO_x$, $WO_x$, $GaO_x$, or $NbO_x$) or p-type (such as $NiO_x$). The third metal oxide compound can be $PO_x$, $NO_x$ or $AsO_x$. In an embodiment, the p-type or n-type layer 112 has a thickness larger than 0 nm and less than or equal to 20 nm. For example, the thickness of the p-type or n-type layer 112 is within a range of 0.5 nm to 15 nm, such as 1 nm, 2 nm, 3 nm, 4 nm, 5 nm, 6 nm, 7 nm, 8 nm, 9 nm, 10 nm, 11 nm, 12 nm, 13 nm, or 14 nm. In some embodiments, when the thickness of the p-type or n-type layer 112 is less than or equal to 5 nm, the contact resistivity between the first metal element-containing structure 114 and the first semiconductor layer 104 can be improved through a tunneling effect.

In some embodiments, when the first semiconductor layer 104 includes a phosphide or arsenide compound, the presence of the p-type or n-type layer 112 may avoid the formation of an interfacial compound that is generated by a direct contact between the first semiconductor layer 104 and the first metal element-containing structure 114. For example, when the first semiconductor layer 104 contains Au and the first semiconductor layer 104 is a phosphide compound (such as GaP), the interfacial compound can be $Au_2P_3$ having a bandgap energy smaller than that of the material of the active region 108 and the interfacial compound may absorb the light emitted from the active region 108.

Figure 2A:
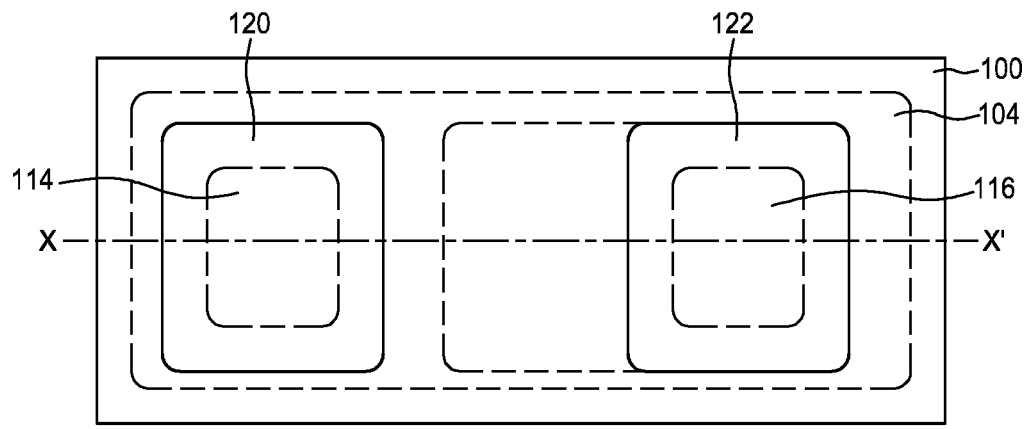
FIG. 2A shows a schematic top view of a semiconductor device in accordance with an embodiment of the present disclosure.
Figure 2B:
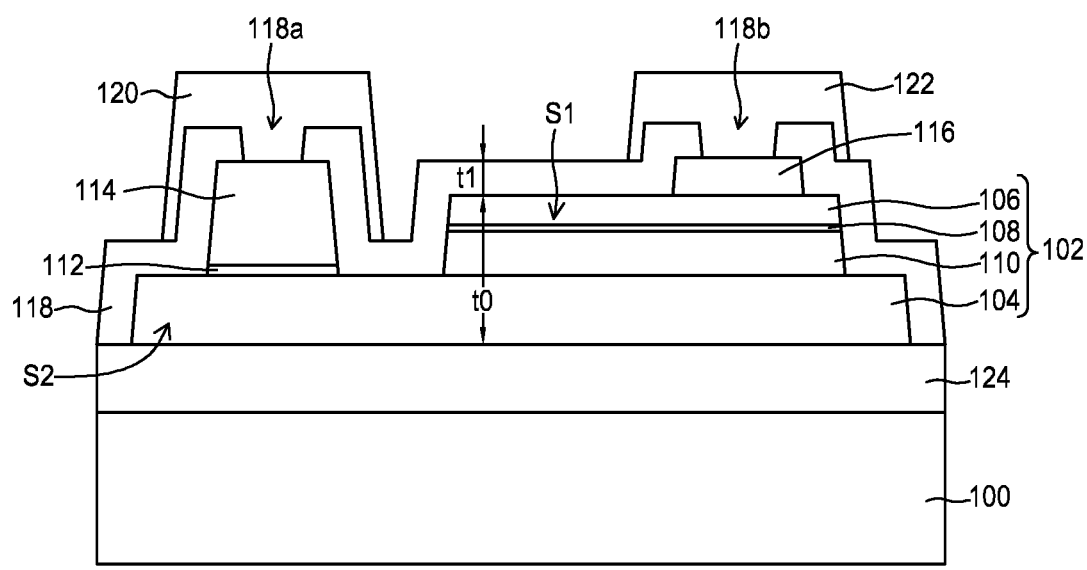
FIG. 2B shows a schematic sectional view of a semiconductor device along X-X' line in FIG. 2A.

FIG. 2A shows a schematic top view of a semiconductor device 20 in accordance with an embodiment of the present disclosure. FIG. 2B shows a schematic sectional view of a semiconductor device 20 along X-X' line in FIG. 2A. For clear illustration, FIG. 2A only shows some layers (as indicated).

The difference between the semiconductor device 20 and the semiconductor device 10 is that the semiconductor device 20 further includes an insulating structure 118 on the semiconductor structure 102, a first electrode pad 120 connected to the first metal element-containing structure 114, a second electrode pad 122 connected to the second metal element-containing structure 116, and an adhesive structure 124 under the first semiconductor layer 104. In the embodiment, the insulating structure 118 conformally covers the semiconductor structure 102, the first metal element-containing structure 114, and the second metal element-containing structure 116. As shown in FIG. 2B, the insulating structure 118 has a first opening 118a and a second opening 118b. The first metal element-containing structure 114 physically contacts the first electrode pad 120 through the first opening 118a, and the second metal element-containing structure 116 physically contacts the second electrode pad 122 through the second opening 118b.

The first electrode pad 120 and the second electrode pad 122 can be used for electrical connection with an external power source (not shown) and can serve as a buffer to absorb stress during process such as wire-bonding or solder bonding. The top surface of the first electrode pad 120 can be at substantially the same level (with a tolerance of about ±1 μm) as the top surface the second electrode pad 122. In the embodiment, the first electrode pad 120 covers a portion of the insulating structure 118 and fills the first opening 118a, and the second electrode pad 122 covers a portion of the insulating structure 118 and fills the second opening 118b. That is, the first mesa structure S1, the insulating structure 118 and the first electrode pad 122 can be overlapped in a vertical direction in some embodiments. The first electrode pad 120 and the second electrode pad 122 can be respectively a single layer or multiple layers. In an embodiment, the material of the first electrode pad 120 and the second electrode pad 122 includes Ni, Ti, Pt, Pd, Ag, Au, Al, Sn, Cu or an alloy thereof.

The insulating structure 118 can protect the semiconductor structure 102 from moisture or contamination, and can improve the reliability of the semiconductor device 20. In an embodiment, the insulating structure 118 includes a dielectric material such as an oxide compound (such as $SiO_2$) or a nitride compound (such as $SiN_x$). In an embodiment, the insulating structure 118 includes a reflective structure such as a distributed Bragg reflector (DBR) formed by alternately stacking two or more semiconductor materials with different refractive indexes. In an embodiment, the insulating structure 118 has a thickness t1 less than 15% or less than 10% of the total thickness t0 of the semiconductor structure 102.

The adhesive structure 124 can be electrically-insulative. In an embodiment, the adhesive structure 124 includes a main layer (not shown) containing a thermosetting polymer. In an embodiment, the thermosetting polymer includes, such as polyimide, epoxy resin, polyester, polyurethane, benzocyclobutene or a combination thereof. In an embodiment, the adhesive structure 124 further includes an auxiliary layer (not shown) between the main layer and the first semiconductor layer 104 or between the main layer and the base 100 for further improving the adhesion therebetween. The material of the auxiliary layer can be different from the main layer. In an embodiment, the material of the auxiliary layer includes an oxide compound (such as $SiO_2$) or a nitride compound (such as SiNx).

For the positions, materials, and related descriptions of other layers or structures, the foregoing embodiments can be referred to, and are not repeatedly described herein.

FIG. 3A to FIG. 3J show the method for manufacturing a semiconductor device 30A in accordance with an embodiment of the present disclosure. It should be noted that although a plurality of the semiconductor devices can be formed in the manufacturing processes, structural changes during the manufacturing processes are described by focusing on one of the semiconductor devices in the following paragraphs for simplicity.

Figure 3A:
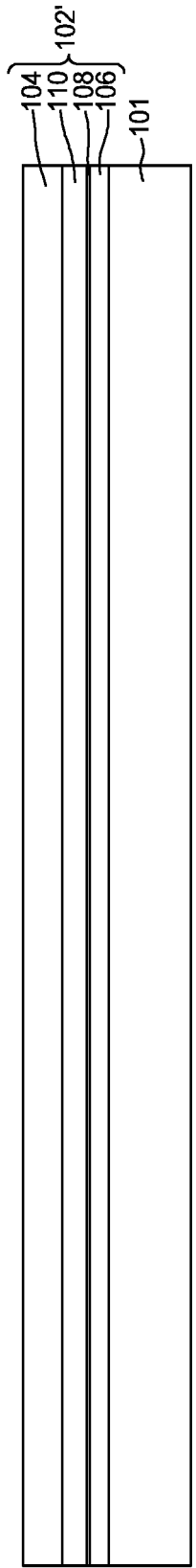

As shown in FIG. 3A, a growth substrate 101 is first provided. A semiconductor stack 102' including a first semiconductor layer 104, a second semiconductor layer 106, and an active region 108 between the first semiconductor layer 104 and the second semiconductor layer 106 is formed on the growth substrate 101. A third semiconductor layer 110 is formed between the first semiconductor layer 104 and the active region 108.

Figure 3B:
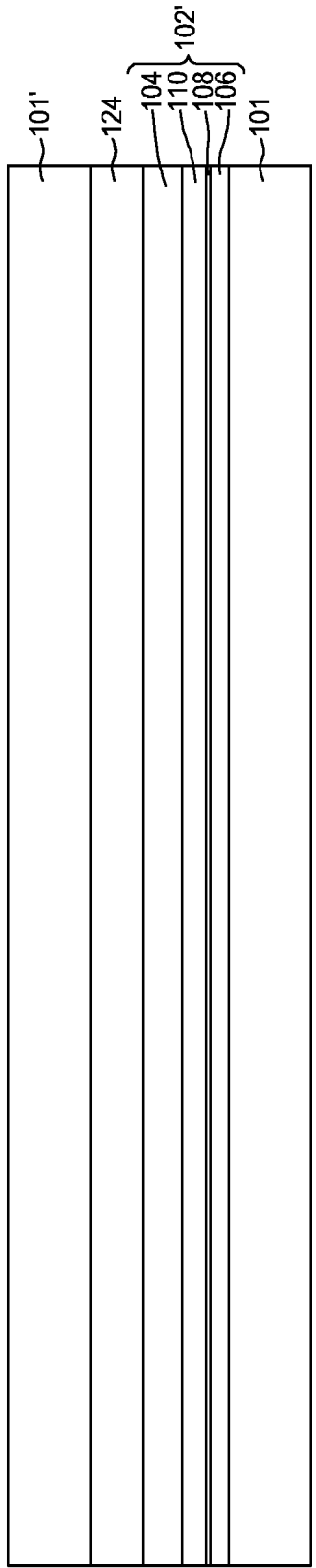
Figure 3C:
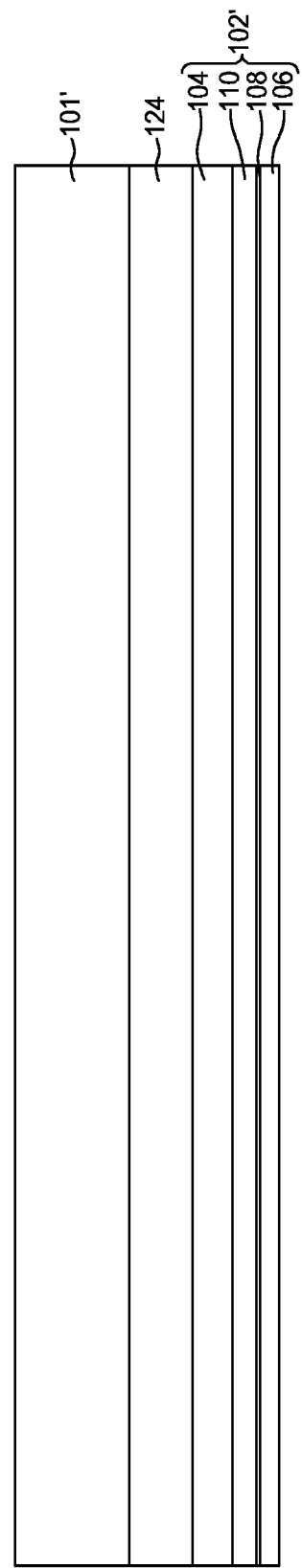

Referring to FIG. 3B and FIG. 3C, the semiconductor stack 102' is then bonded to a bonding substrate 101' via an adhesive structure 124, and the growth substrate 101 is removed.

Next, as shown in FIG. 3D, the structure of FIG. 3C is reversed and a portion of the semiconductor stack 102' is removed so that a portion of the first semiconductor layer 104 is exposed, and a first mesa structure S1 is formed on the first semiconductor layer 104.

Referring to FIG. 3E, a p-type or n-type layer 112 is then formed on the exposed portion of the first semiconductor layer 104, and a first metal element-containing structure 114 is formed on the p-type or n-type layer 112. In an embodiment, the p-type or n-type layer 112 is formed by film deposition such as atomic layer deposition (ALD) or e-gun evaporation.

In an embodiment, forming the first metal element-containing structure 114 includes forming a structure containing a first metal element M1 on the p-type or n-type layer 112, and conducting a first heating process at a first temperature. In an embodiment, the heating process can be an alloying process for forming an alloy containing the first metal element M1 and another metal element (such as the third metal element M3 mentioned above). The first temperature is an environmental temperature provided by equipment (such as a furnace) for the first heating process. In an embodiment, the first temperature can be less than a thermal decomposition temperature of the thermosetting polymer contained in the adhesive structure 124, or a difference between the first temperature and the thermal decomposition temperature is less than or equal to 50° C. or 30° C., thereby the process stability can be ensured. The thermal decomposition temperature is the temperature at which the weight loss of the thermosetting polymer exceeds 1% in an hour.

As shown in FIG. 3F and FIG. 3G, a second metal element-containing structure 116 is further formed on the first mesa structure S1, and a portion of the first semiconductor layer is removed to form a second mesa structure S2. Forming the second metal element-containing structure 116 can include forming a structure containing a second metal element M2 on the second semiconductor layer 106, and conducting a second heating process at a second temperature. The second temperature is an environmental temperature provided by equipment (such as a furnace) for the second heating process. In an embodiment, the difference between the first and the second temperatures is less than 50° C. or 30° C. In an embodiment, the first temperature and the second temperature are respectively lower than 500° C. or 400° C. In an embodiment, the first temperature and the second temperature respectively higher than or equal to 200° C. or 300° C.

Referring to FIG. 3H, an insulating structure 118 is then comformally formed on the first mesa structure S1, the second mesa structure S2, the first metal element-containing structure 114 and the second metal element-containing structure 116. Side walls of the first mesa structure S1 and the second mesa structure S2 are all covered by the insulating structure 118 such that the semiconductor structure 102 can be fully protected. A first opening 118a and a second opening 118b are formed by removing a portion of the insulating structure 118.

Then, referring to FIG. 3I, a first electrode pad 120 and a second electrode pad 122 are formed on the first metal element-containing structure 114 and the second metal element-containing structure 116, respectively.

The structure as shown in FIG. 3I can be further separated into a plurality of semiconductor devices 30A by a cutting method such as laser cutting. FIG. 3J shows the structure of each semiconductor device 30A.

FIG. 3K shows a schematic sectional view of a semiconductor device 30B in accordance with an embodiment of the present disclosure. As shown in FIG. 3K, in an embodiment, the first electrode pad 120 can also be formed on a portion of the first mesa structure S1 so as to improve the structural strength of the semiconductor device. In an embodiment, the first electrode pad 120 can have varied thicknesses, or the first electrode pad 120 can have a non-planar top surface. As shown in FIG. 3K, the first electrode pad 120 can include a first part 120a with a first thickness h1 on the first metal element-containing structure 114 and a second part 120b with a second thickness h2 on the first mesa structure S1. and the second thickness h2 can be less than the first thickness h1.

FIG. 3L shows a schematic sectional view of a semiconductor device 30C in accordance with an embodiment of the present disclosure. As shown in FIG. 3L, the p-type or n-type layer 112 is conformally formed on an upper surface of the semiconductor structure 102. In the embodiment, the p-type or n-type layer 112 physically contacts the first metal element-containing structure 114, the second metal element-containing structure 116 and the insulating structure 118. Specifically, as shown in the FIG. 3L, the p-type or n-type layer 112 covers and physically contacts a first side surface e1, a second side surface e2 and a top surface e3 of the first mesa structure S1, and a top surface e4 of the second mesa structure S2. In the embodiment, the p-type or n-type layer 112 does not cover on side walls of the first semiconductor layer 104. The p-type or n-type layer 112 physically contacts the second metal element-containing structure 116, and is not overlapped with the second metal element-containing structure 116 in a vertical direction. In the embodiment, the p-type or n-type layer 112 has a lower contact resistivity along the vertical direction than along the horizontal direction, so that no current path can be formed between the second metal element-containing structure 116 and the first metal element-containing structure 114 or the first semiconductor layer 104 during operation of the semiconductor device 20". FIG. 3M shows a schematic sectional view of a semiconductor device 30D in accordance with an embodiment of the present disclosure. As shown in FIG. 3M, the p-type or n-type layer 112 can further cover a portion of a top surface e5, a third side surface e6 and a fourth side surface e7 of the second metal element-containing structure 116, such that the second metal element-containing structure 116 physically contacts the second electrode pad 122 at the rest portion of the top surface e5 which is not covered by the p-type or n-type layer 112. To form the structure shown in FIG. 3M, in the manufacturing process the second metal element-containing structure 116 is formed on the first mesa structure S1 before forming the p-type or n-type layer 112 on the first mesa structure S1 and a portion of the second metal element-containing structure 116, and the first metal element-containing structure 114 is further formed on the p-type or n-type layer 112.

For the positions, materials, and related descriptions of other layers or structures, the foregoing embodiments can be referred to, and are not repeatedly described herein.

Figure 4A:
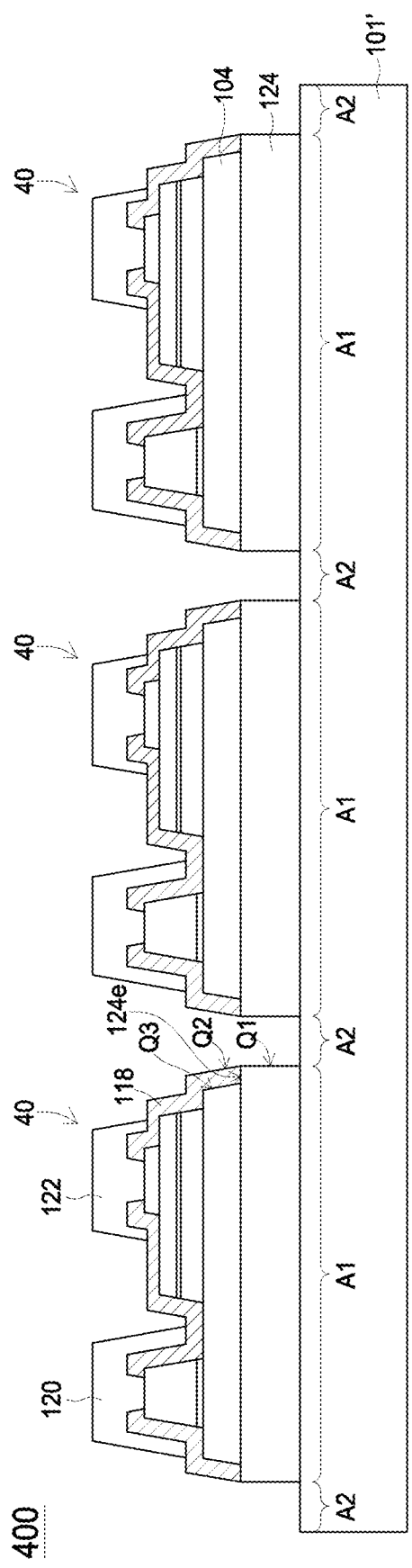
FIG. 4A shows a schematic sectional view of a semiconductor component in accordance with an embodiment of the present disclosure.
Figure 4B:
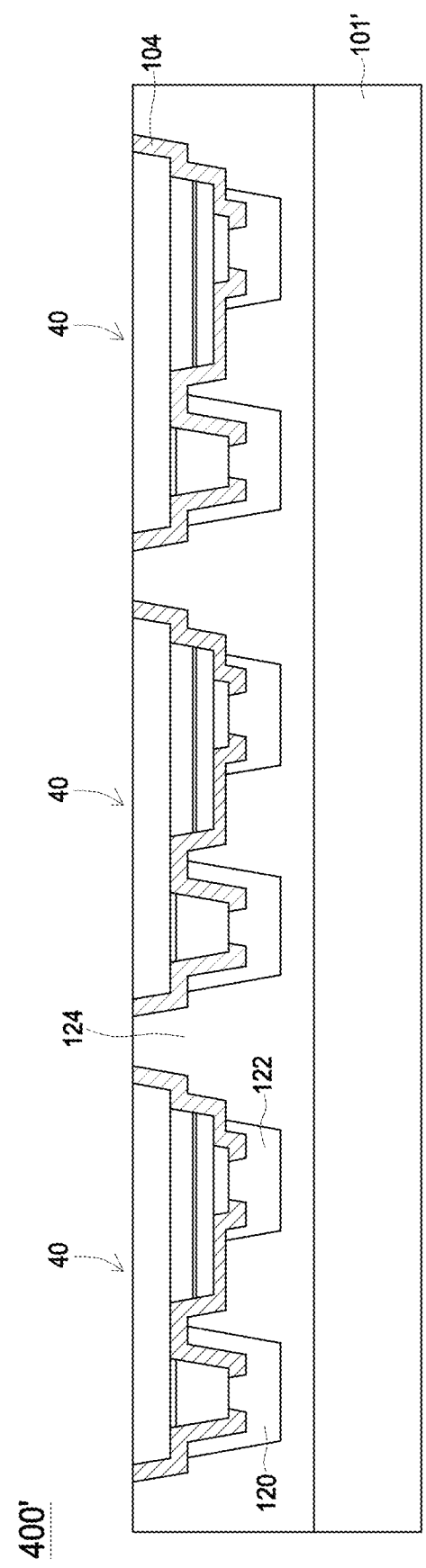
FIG. 4B shows a schematic sectional view of a semiconductor component in accordance with an embodiment of the present disclosure.

FIG. 4A shows a schematic sectional view of a semiconductor component 400 in accordance with an embodiment of the present disclosure. FIG. 4B shows a schematic sectional view of a semiconductor component 400' in accordance with an embodiment of the present disclosure.

As shown in FIG. 4A and FIG. 4B, the semiconductor component 400 or the semiconductor component 400' includes a plurality of semiconductor devices 40. The structure of each semiconductor device 40 in FIG. 4A is similar to the structure of the semiconductor device 30A as described above. Specifically, the semiconductor device 40 can be a semiconductor device as described in any embodiment of the present disclosure (the semiconductor device 10, 20, 30B, 30C or 30D).

In FIG. 4A and FIG. 4B, the semiconductor devices 40 are devoid of the growth substrate 101. Referring to FIG. 4A, a plurality of semiconductor devices 40 are arranged on a bonding substrate 101'. In the embodiment, the bonding substrate 101' includes a first area A1 covered by the adhesive structure 124 and a second area A2 not covered by the adhesive structure 124. Specifically, the first area A1 is overlapped with the semiconductor device 40 in a vertical direction. That is, in FIG. 4A, the adhesive structure 124 is not continuously distributed on the bonding substrate 101'. In FIG. 4A, the adhesive structure 124 has an upper edge 124e and a side wall Q1, and the insulating structure 118 covers the upper edge 124e without covering the side wall Q1. In the embodiment, the insulating structure 118 has a side wall Q2 overlapped with the side wall Q1 in the vertical direction. The side wall Q1 is not overlapped with a side wall Q3 of the first semiconductor layer 104 in the vertical direction. In one embodiment, the adhesive structure 124 has an upper surface near the upper edge 124e not covered by the insulating structure 118. In one embodiment, the adhesive structure 124 has a width less than or equal to that of the first semiconductor layer 104.

FIG. 4B shows another arrangement in which the plurality of semiconductor devices 40 are embedded in the adhesive structure 124. As shown in FIG. 4B the adhesive structure 124 is continuously distributed on the bonding substrate 101' and physically contacts more than one semiconductor devices 40. In some embodiments, the adhesive structure 124 may help to fix the semiconductor device 40 at a predetermined position and to protect the semiconductor structure 102 in the semiconductor device 40 during transportation.

In one embodiment, a blue tape, thermal release sheet or tape, light (UV) release tape (such as polyethylene terephthalate (PET)) is provided between the semiconductor devices 40 and the bonding substrate 101'. Specifically, the blue tape, thermal release sheet or tape, light (UV) release tape is provided between the adhesive structure 124 and the bonding substrate 101' or directly contacts and covers the electrode pads 120, 122 of the semiconductor devices 40.

For the positions, materials, and related descriptions of other layers or structures, the foregoing embodiments can be referred to, and are not repeatedly described herein.

Figure 5A:
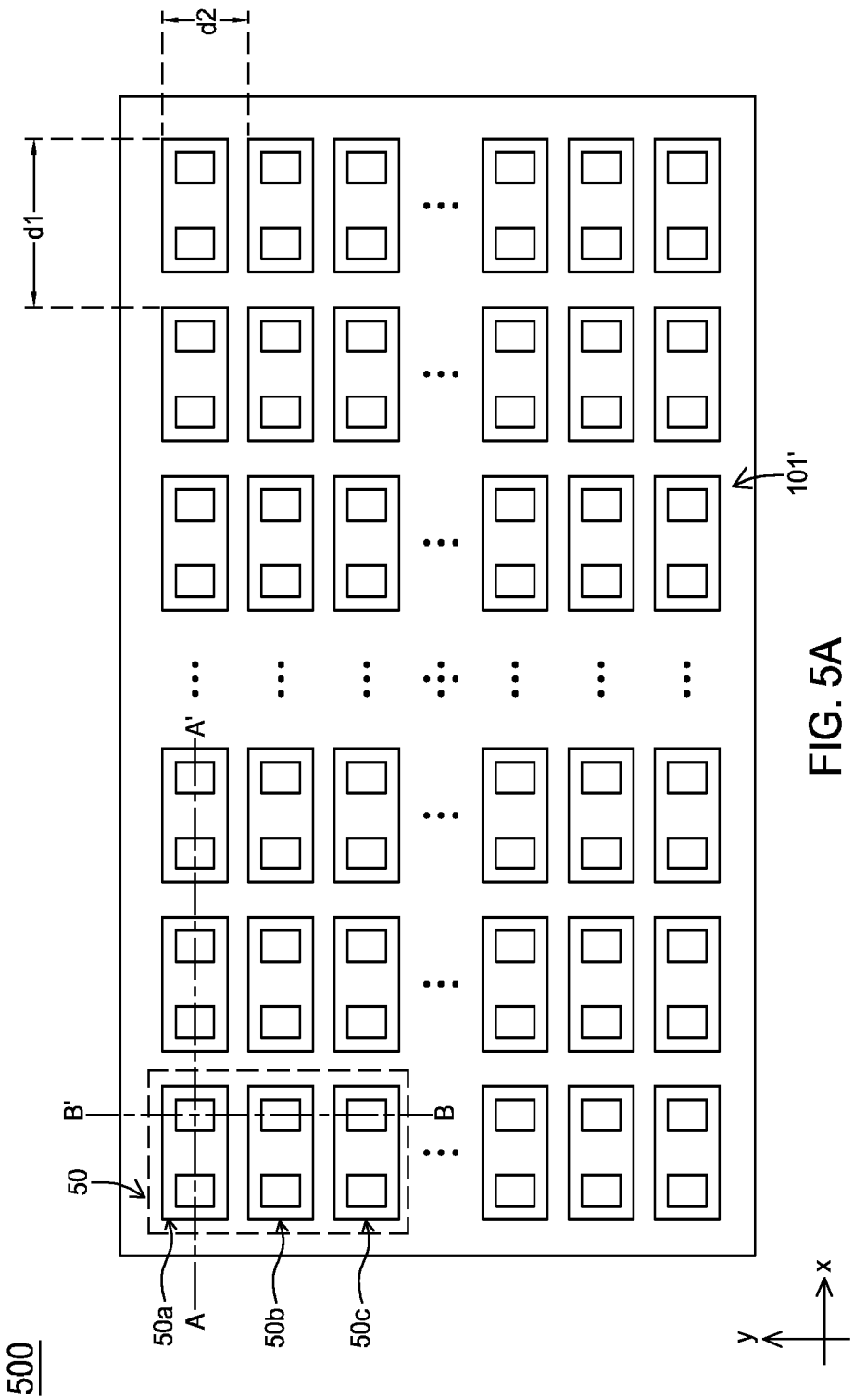
FIG. 5A shows a schematic top view of a display panel in accordance with an embodiment of the present disclosure.
Figure 5B:
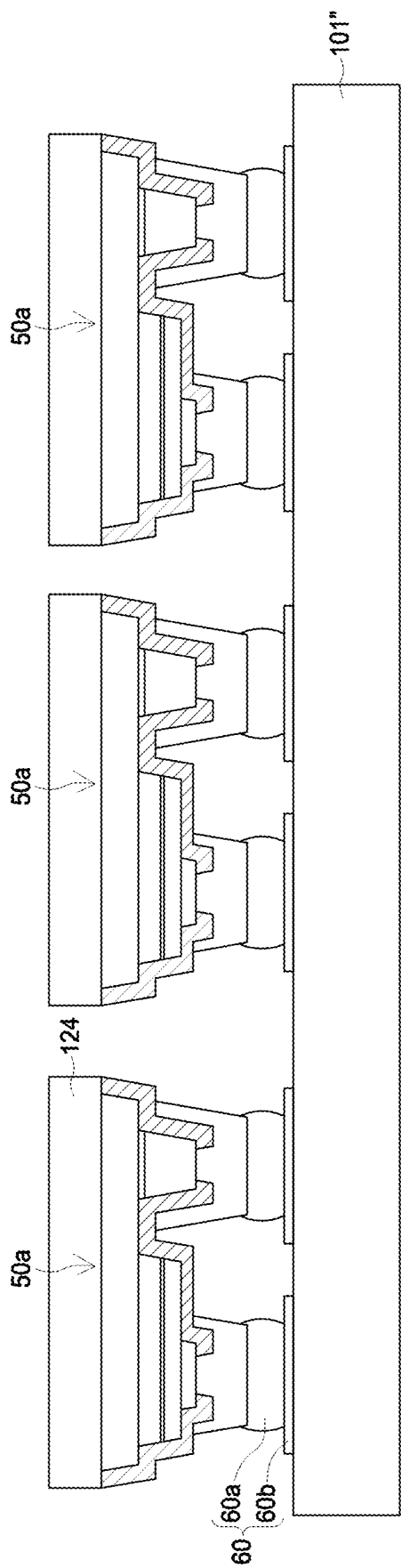
FIG. 5B and FIG. 5C show schematic partial sectional views of a display panel in accordance with an embodiment of the present disclosure.
Figure 5C:
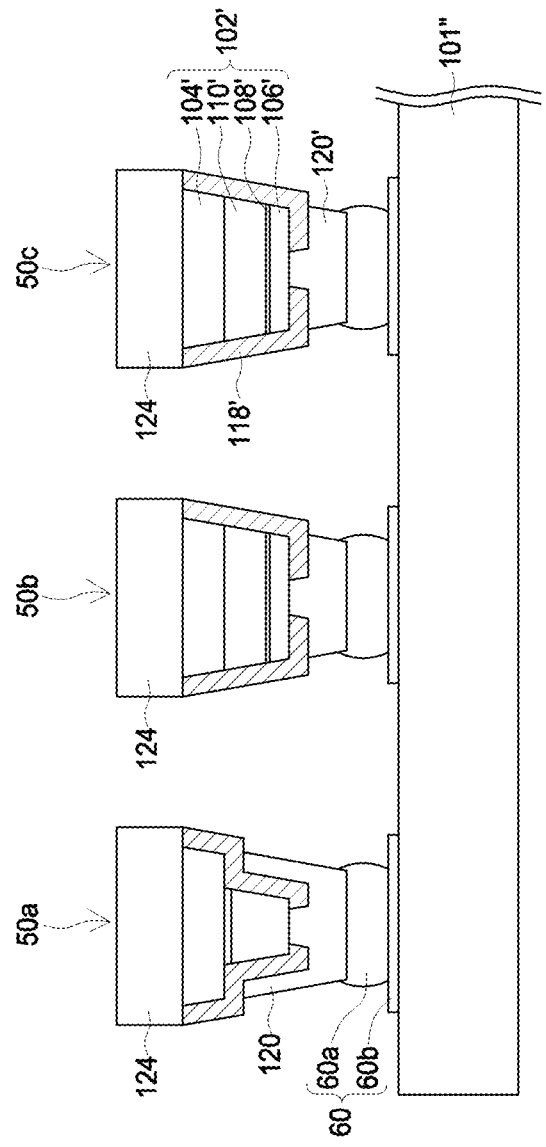

FIG. 5A shows a schematic top view of a display panel 500 in accordance with an embodiment of the present disclosure. FIG. 5B and FIG. 5C show schematic partial sectional views of the display panel 500 in accordance with an embodiment of the present disclosure. Specifically, FIG. 5B shows a sectional view along A-A' line and FIG. 5C shows a sectional view along B-B' line in FIG. 5A.

In the embodiment, the display panel 500 includes a carrier substrate 101" and a plurality of pixel units 50 on the carrier substrate 101" and arranged in row direction x and column direction y. The plurality of pixel units 50 may be formed on the carrier substrate 101" by a transfer method. The carrier substrate 101" may be glass, plastic, a silicon substrate, or a printed circuit board (PCB). Each pixel unit 50 includes a plurality of semiconductor devices. In the embodiment, each pixel unit 50 includes three semiconductor devices 50a, 50b and 50c. Specifically, the semiconductor devices 50a, 50b and 50c are arranged with a first pitch d1 along the row direction x, and second pitch d2 along the column direction y in the embodiment. In an embodiment, the first pitch d1 is less than or equal to 100 μm, and the second pitch d2 is less than or equal to 50 μm. The semiconductor devices 50a, 50b and 50c may respectively emit light in different wavelength ranges. For example, the semiconductor devices 50a, 50b and 50c may emit red light, green light and blue light, respectively. A driving circuit and a control unit (not shown) can be further provided on the carrier substrate 101" for driving the pixel units 50 and controlling the light emitting time of the pixel units 50.

As shown in FIG. 5B and FIG. 5C, each of the semiconductor devices 50a, 50b and 50c is electrically connected to the carrier substrate 101" through a contact structure 60 containing a connection layer 60a and a circuit electrode 60b. In the embodiment, the semiconductor devices 50a can be a semiconductor device as described in any embodiment of the present disclosure (such as the semiconductor device 10, 20, 30A, 30B, 30C or 30D), and the semiconductor devices 50b and 50c can have structures different from that of the semiconductor devices 50a.

As shown in FIG. 5C, each of the semiconductor devices 50b and 50c includes a semiconductor stack 102' having a first semiconductor layer 104', a second semiconductor layer 106', an active region 108' between the first semiconductor layer 104' and the second semiconductor layer 106', and a third semiconductor layer 110' between the first semiconductor layer 104' and the active region 108', and an insulating structure 118 covers side walls and a portion of surface of the semiconductor stack 102', and an electrode pad 120' electrically connected to the semiconductor stack 102'. In some embodiments, the active region 108' is overlapped with the electrode pad 120', while the electrode pad 120 can be overlapped or not overlapped with the active region 108 (not shown). In an embodiment, the material of the active region 108' is different from the active region 108. For example, the active region 108' includes element N and the active region 108 includes element As or element P. In an embodiment, a conductive layer (not shown) can be further disposed between the second semiconductor layer 106' and the electrode pad 120'. The conductive layer includes a conductive oxide such as ITO.

FIG. 5D and FIG. 5E show schematic partial sectional views of the display panel 500 in accordance with another embodiment of the present disclosure. Specifically, FIG. 5D shows a sectional view along A-A' line and FIG. 5E shows a sectional view along B-B' line in FIG. 5A. In the embodiment, the semiconductor devices 50a, 50b and 50c are devoid of the adhesive structure 124 so that thickness of each semiconductor device can be further reduced.

For the positions, materials, and related descriptions of other layers or structures, the foregoing embodiments can be referred to, and are not repeatedly described herein.

Based on the above, in accordance with the embodiments of the present disclosure, a semiconductor device, a method for manufacturing a semiconductor device, a semiconductor component or a display panel can be provided. The semiconductor device provided in the present disclosure exhibits improved optical-electrical characteristics such as contact resistance and process stability. Specifically, the semiconductor device or the semiconductor component of the present disclosure can be applied to products in various fields, such as illumination, medical care, display, communication, sensing, or power supply system. For example, the semiconductor device can be used in a light fixture, monitor, mobile phone, tablet, an automotive instrument panel, a television, computer, wearable device (such as watch, bracelet or necklace), traffic sign, outdoor display device, or medical device.

It should be realized that each of the embodiments mentioned in the present disclosure is used for describing the present disclosure, but not for limiting the scope of the present disclosure. Any obvious modification or alteration is not departing from the spirit and scope of the present disclosure. Furthermore, aforementioned embodiments can be combined or substituted under proper condition and are not limited to specific embodiments described above. A connection relationship between a specific component and another component specifically described in an embodiment can also be applied in another embodiment and is within the scope as claimed in the present disclosure.

What is claimed is:

1. A semiconductor device, comprising:
   a first semiconductor layer having a surface comprising a first portion and a second portion;
   an active region located on the first portion;
   a p-type or n-type layer comprising an oxygen element (O) and a metal element, located on the second portion; and
   a first metal element-containing structure located on the p-type or n-type layer;
   wherein the p-type or n-type layer physically contacts the first metal element-containing structure and the first semiconductor layer;
   wherein the p-type or n-type layer has a conductivity type different from the conductivity type of the first semiconductor layer.

2. The semiconductor device of claim 1, further comprising a second semiconductor layer and a third semiconductor layer, wherein the active region is located between the first semiconductor layer and the second semiconductor layer, and the third semiconductor layer is located between the active region and the first semiconductor layer.

3. The semiconductor device of claim 2, wherein the second semiconductor layer, the active region and the third semiconductor layer forms a first mesa structure, and the first semiconductor layer forms a second mesa structure, and wherein the first mesa structure has a first width W1 and the second mesa structure has a second width W2 larger than the first width W1.

4. The semiconductor device of claim 1, wherein the semiconductor device has a total thickness t0, a width and a length, and a ratio of the total thickness t0 to the width or the length of the semiconductor device is less than or equal to 0.5.

5. The semiconductor device of claim 1, further comprising a substrate and an adhesive structure between the substrate and the first semiconductor layer, and the adhesive structure comprises a thermosetting polymer.

6. The semiconductor device of claim 1, wherein the first metal element-containing structure comprises an alloy and is devoid of Be.

7. The semiconductor device of claim 1, wherein the active region comprises AlGaInAs, InGaAsP, AlGaAsP or AlGaInP.

8. The semiconductor device of claim 1, wherein the p-type or n-type layer is not overlapped with the active region in a vertical direction.

9. The semiconductor device of claim 1, wherein a material of the p-type or n-type layer has a first contact resistivity in a vertical direction, a second contact resistivity in a horizontal direction, and the second contact resistivity is higher than the first contact resistivity.

10. The semiconductor device of claim 1, wherein the p-type or n-type layer has a thickness larger than 0 nm and less than or equal to 20 nm.

11. A method for manufacturing a semiconductor device, comprising:
    providing a first semiconductor layer having a surface comprising a first portion and a second portion;
    forming an active region located on the first portion;
    forming a p-type or n-type layer comprising an oxygen element (O) and a metal element and located on the second portion; and
    forming a first metal element-containing structure located on the p-type or n-type layer;
    wherein the p-type or n-type layer physically contacts the first metal element-containing structure and the first semiconductor layer;
    wherein the p-type or n-type layer has a conductivity type different from the conductivity type of the first semiconductor layer.

12. The method of claim 11, further comprising forming a second semiconductor layer, wherein the active region is located between the first semiconductor layer and the second semiconductor layer.

13. The method of claim 12, further comprising forming a substrate and an adhesive structure between the substrate and the first semiconductor layer.

14. The method of claim 13, wherein forming the first metal element-containing structure comprises conducting a heating process at a first temperature, the adhesive structure comprises a thermosetting polymer with a thermal decomposition temperature, and the first temperature is less than the thermal decomposition temperature or a difference between the first temperature and the thermal decomposition temperature is less than or equal to 50° C.

15. The method of claim 14, wherein the first temperature is less than 400° C.

16. The semiconductor device of claim 1, wherein the p-type or n-type layer has a thickness less than that of the first metal element-containing structure.

17. The semiconductor device of claim 1, further comprising an insulating structure that covers the first metal element-containing structure.

18. The semiconductor device of claim 17, further comprising a first electrode pad, wherein the first electrode pad covers the insulating structure and has a portion overlapped with the active region in a vertical direction.

19. The semiconductor device of claim 18, wherein the first electrode pad has varied thicknesses or has a non-planar top surface.

20. A display panel comprising:
    a plurality of pixel units, each comprising:
    a first semiconductor device of claim 1;
    a second semiconductor device emitting a blue light; and
    a third semiconductor device emitting a green light.

* * * * *